(12) United States Patent
Eichhorner et al.

(10) Patent No.: US 8,106,567 B2
(45) Date of Patent: Jan. 31, 2012

(54) SWITCHED MODE POWER SUPPLY

(75) Inventors: Bernhard Eichhorner, Vienna (AT); Harald Schweigert, Vienna (AT)

(73) Assignee: Siemens Aktiengesellschaft, Munich (DE)

( * ) Notice: Subject to any disclaimer, the term of this patent is extended or adjusted under 35 U.S.C. 154(b) by 291 days.

(21) Appl. No.: 12/311,147

(22) PCT Filed: Jul. 10, 2007

(86) PCT No.: PCT/EP2007/057038
§ 371 (c)(1), (2), (4) Date: Mar. 19, 2009

(87) PCT Pub. No.: WO2008/040578
PCT Pub. Date: Apr. 10, 2008

(65) Prior Publication Data
US 2010/0038994 A1   Feb. 18, 2010

(30) Foreign Application Priority Data
Oct. 4, 2006  (DE) .......................... 10 2006 046 982

(51) Int. Cl.
H01L 41/08 (2006.01)
(52) U.S. Cl. .................. 310/330; 310/331; 310/317
(58) Field of Classification Search .............. 363/21, 363/25, 141; 310/330–332
See application file for complete search history.

(56) References Cited

U.S. PATENT DOCUMENTS

| | | | |
|---|---|---|---|
| 4,595,338 A | 6/1986 | Kolm et al. | |
| 4,780,062 A | 10/1988 | Yamada et al. | |
| 5,008,582 A * | 4/1991 | Tanuma et al. | 310/332 |
| 5,667,564 A * | 9/1997 | Weinberg | 96/58 |
| 5,825,642 A * | 10/1998 | Ishii et al. | 363/141 |
| 7,031,155 B2 * | 4/2006 | Sauciuc et al. | 361/695 |
| 7,061,161 B2 | 6/2006 | Scher et al. | |
| 7,556,406 B2 * | 7/2009 | Petroski et al. | 362/294 |
| 7,714,433 B2 * | 5/2010 | Campini et al. | 257/722 |
| 7,742,299 B2 * | 6/2010 | Sauciuc et al. | 361/695 |
| 2003/0107907 A1 | 6/2003 | Mihai et al. | |
| 2004/0080393 A1 | 4/2004 | Phadke | |
| 2004/0253130 A1 | 12/2004 | Sauciuc et al. | |

FOREIGN PATENT DOCUMENTS

| | | |
|---|---|---|
| DE | 202005015312 U1 | 3/2006 |
| EP | 1748688 A | 1/2007 |
| JP | 59158541 A | 9/1984 |
| JP | 61500865 T | 5/1986 |
| JP | 62061993 A | 3/1987 |
| JP | 62061994 A | 3/1987 |

(Continued)

OTHER PUBLICATIONS

Communication from Foreign Patent Office, Aug. 11, 2011, pp. 1-5.

(Continued)

*Primary Examiner* — Mark Budd

(57) ABSTRACT

A switched mode power supply is provided. The switched mode power supply includes a transformer, which includes at least one primary winding connected to a DC voltage via a switching element and a secondary winding connected to a load via a rectifier circuit including at least one diode, and at least one piezoelectric fan which generates an air flow at the transformer and/or at the switching element and/or at the diode. The air flow produced can be guided in a targeted manner onto the components to be cooled, with the air flow remaining low and therefore, no contamination by air particles arises.

15 Claims, 6 Drawing Sheets

FOREIGN PATENT DOCUMENTS

| | | |
|---|---|---|
| JP | 01137597 A | 5/1989 |
| JP | 3040462 A | 2/1991 |
| JP | 06071226 A | 3/1994 |
| JP | 10143257 A | 5/1998 |
| JP | 2000261173 A | 9/2000 |
| JP | 2001095233 A | 4/2001 |
| JP | 2005033088 A | 2/2005 |
| JP | 2006041314 A | 2/2006 |
| SU | 1679958 A1 | 11/2004 |
| WO | WO 8502231 A | 5/1985 |
| WO | WO 9612924 A1 | 5/1996 |

OTHER PUBLICATIONS

Communication from Japanese Patent Office citing references, received. Aug. 11, 2011, pp. 1-5.

* cited by examiner

SWITCHED MODE POWER SUPPLY

CROSS REFERENCE TO RELATED APPLICATIONS

This application is the US National Stage of International Application No. PCT/EP2007/057038, filed Jul. 10, 2007 and claims the benefit thereof. The International Application claims the benefits of German application No. 10 2006 046 982.8 DE filed Oct. 4, 2006, both of the applications are incorporated by reference herein in their entirety.

FIELD OF INVENTION

The invention relates to a switched mode power supply with a transformer, which comprises at least one primary winding, which can be connected to a DC voltage via a switching element and which comprises at least one secondary winding, which can be connected to a load via a rectifier circuit comprising at least one diode.

BACKGROUND OF INVENTION

Switched mode power supplies are known in a wide variety of developments and are used to connect electrical loads to a power grid or to a power source. A distinction is made for example between switched mode power supplies, which operate as blocking oscillator converters, push-pull converters or as flux converters, etc. Electrical energy is transmitted via a transformer from a primary side to a secondary side. The voltage applied at the primary side is clocked in the process by means of a switching element, the clock frequency corresponding to a multiple of the mains frequency. The transformer can accordingly be small owing to the high clock frequency.

It should be noted in this connection that heat is produced in the components of a switched mode power supply, which has to be dissipated using separate means so the temperatures of individual components does not reach a critical value. Moreover, the power that can be transmitted by a switched mode power supply is dependent on the temperature of individual components.

The generation of heat in the transformer, switching element and in the secondary-side rectifier diode should be observed in particular.

According to the prior art different methods are known for dissipating the heat produced in a switched mode power supply. The energy that needs to be expended to operate any cooling devices that may be provided should be noted in this connection.

Thus US 2003/0107907 for example describes a switched mode power supply which uses the parasitic energy of the switching element to drive a fan.

However, the use of fans, known from the prior art, to increase the cool air throughflow in switched mode power supply casings has the drawback that the components arranged in the casing are quickly soiled by various air-borne particles. This can impair operatability, for which reason a dust filter is usually arranged at the ventilation inlet of the casing. This leads to increased expenditure on maintenance, however, as these dust filters have to be regularly replaced.

According to the prior art natural air convection is usually used for cooling switched mode power supplies. In this case ventilation apertures are arranged in the switched mode power supply casing, via which heated air can escape upwards and fresh air can flow in from below. The arrangement of the heat-generating components inside the casing is usually guided by the prevailing flow conditions. JP 2001 095 233 for example describes the arrangement of a plurality of converter modules inside a switched mode power supply casing. The higher-power converter modules are cooled more effectively by this arrangement than the lower-power converter modules.

In addition heat sinks may be arranged, which are thermally connected to components for cooling and dissipate heat to the environment. JP 2005 033 088 for example describes the arrangement of cooling ribs that project from a casing and thus dissipate heat from switched mode power supply components to the environment.

Other known measures for cooling switched mode power supplies relate to the configuration of individual heat-generating components. US 2004/0080393 thus discloses a ring transformer for use in switched mode power supplies in which the winding material is advantageously arranged for heat dissipation.

JP 2006041314 A1 also describes a specific development of the winding material for transformers in a switched mode power supply. In this case the secondary winding of the transformer is formed as a heat pipe, whereby good heat transfer is achieved even with low convection. The expenditure on construction and the restriction in the design of the transformer should be noted in this connection, however.

SUMMARY OF INVENTION

The object underlying the invention is to disclose a solution for cooling heat-generating components for switched mode power supplies, wherein the expenditure on construction, the maintenance requirements and the energy requirement should be low and wherein there should be no contamination due to excessive cooling air throughflow.

According to the invention this object is achieved by a switched mode power supply of the type described in the introduction, the switched mode power supply comprising at least one piezoelectric fan, which brings about an air flow at the transformer and/or at the switching element and/or at the diode.

The advantage of a piezoelectric fan for use in a switched mode power supply lies in the mode of operation: the air flow generated can be guided in a targeted manner onto the components to be cooled, with the air throughflow in total remaining low and therefore no contamination occurring by means or air-borne dirt particles. Moreover, a piezoelectric fan consumes only a very small amount of energy, so the effect on the efficiency of the switched mode power supply is negligibly low.

In contrast to a fan, with a piezoelectric fan there is no life-limiting bearing and also no need for air filters, for which reason a switched mode power supply according to the invention is substantially maintenance-free. The simple construction of a piezoelectric fan also allows simple constructional arrangement inside a switched mode power supply.

In an advantageous development of the invention a microcontroller is provided for controlling the switching element and the at least one piezoelectric fan. This microcontroller can then be used in a simple manner for implementing various control requirements.

A further advantageous development of the invention provides that the at least one piezoelectric fan is formed from a substantially lamellar blade, one end of the blade being arranged so as to freely swing and a second end of the blade being held in a holder, and the blade being electrically conductively connected to a control unit. Reliable quality piezoelectric fans of this kind can already be obtained on the market and can be easily assembled.

It is also advantageous if the switched mode power supply has an even number of piezoelectric fans, which are arranged in such a way that the forces of inertia of the freely swinging ends of the blades increase with diametrically opposed synchronous excitation of the blades. The constructional requirements relating to fastening of a piezoelectric fan inside a switched mode power supply are therefore reduced further as the body mass of the holder required to avoid vibrations with an odd number of blades does not apply.

It is also advantageous if the holder of the at least one piezoelectric fan is rigidly connected to the transformer. The mass of the transformer for avoiding vibrations is therefore used on the one hand and on the other hand the air flow is guided directly onto the transformer as one of the primary heat-critical components.

Similarly it is advantageous to rigidly connect the holder of the at least one piezoelectric fan to a heat sink arranged in the switched mode power supply. With this development the heat sink acts as a counterweight to the piezoelectric fans and is cooled directly by the generated air flow. The switching elements in thermal contact with the heat sink are also cooled.

For a method for operating a switched mode power supply according to the invention it is advantageous if the at least one piezoelectric fan is caused to swing with predefined excitation frequency by means of a control signal. This ensures that the air flow generated by the piezoelectric fan can be adjusted to the thermal conditions in the switched mode power supply at any time.

It is advantageous in this connection if the control signal is formed by means of a microcontroller. Switched mode power supplies usually have a programmable microcontroller which can be used without additional expenditure on hardware to generate a suitable control signal of the piezoelectric fan.

It is also advantageous if a sinusoidal signal is generated as the control signal. Owing to its function as a control unit for the switched mode power supply with the requirement of a sinusoidal power demand, the microcontroller of a switched mode power supply is particularly suitable for generating sinusoidal signals, for example by means of D/A converters or as a smoothed or filtered PWM signal. The mechanical oscillation form of the blade is also substantially sinusoidal, for which reason a sinusoidal control signal keeps the mechanical loading of the blade low. Switched mode power supplies are therefore particularly suitable for the use of piezoelectric fans.

An advantageous development of the method also provides that the power consumption of the at least one piezoelectric fan is detected by means of microcontrollers as a function of the excitation frequency, so a resonance frequency is detected at maximum power consumption. As the resonance frequency for each individual piezoelectric fan can vary slightly, this method ensures that the resonance frequency of the piezoelectric fan fitted in the switched mode power supply is available as a controlled variable.

It is advantageous in this connection if, during operation, gradual variation of the excitation frequency re-adjusts the resonance frequency, which changes as a consequence of environmental influences, such as the ambient temperature, at predefined intervals, and if, when the switched mode power supply is put into operation, the last-adjusted resonance frequency is predefined as the excitation frequency. The predefined intervals for adjusting the resonance frequency can be very short, so, in the case of changing environmental conditions, the piezoelectric fan is continuously operated at maximum power consumption.

It is also advantageous if those power values, which are detected in the case of undamaged, freely-swinging blades of the at least one piezoelectric fan, are programmed into the microcontroller for predefined excitation frequencies and associated tolerance values (to take account of changed environmental conditions), and if the frequency of the control signal is altered at predefined intervals during operation, so altered resonance frequencies are detected. The microcontroller therefore immediately detects if the resonance frequency of the piezoelectric fan changes beyond the tolerance limits, and this can usually be attributed to a crack in the blade or to contact with a foreign body. The pre-requirements are therefore established that the switched mode power supply should be switched off if the piezoelectric fan is in a critical state, before components of the switched mode power supply incur damage, and the result can be signaled to maintenance or operating staff.

BRIEF DESCRIPTION OF THE DRAWINGS

The invention will be described by way of example hereinafter with reference to the accompanying figures, in which, schematically.

DETAILED DESCRIPTION OF INVENTION

Figure 1:
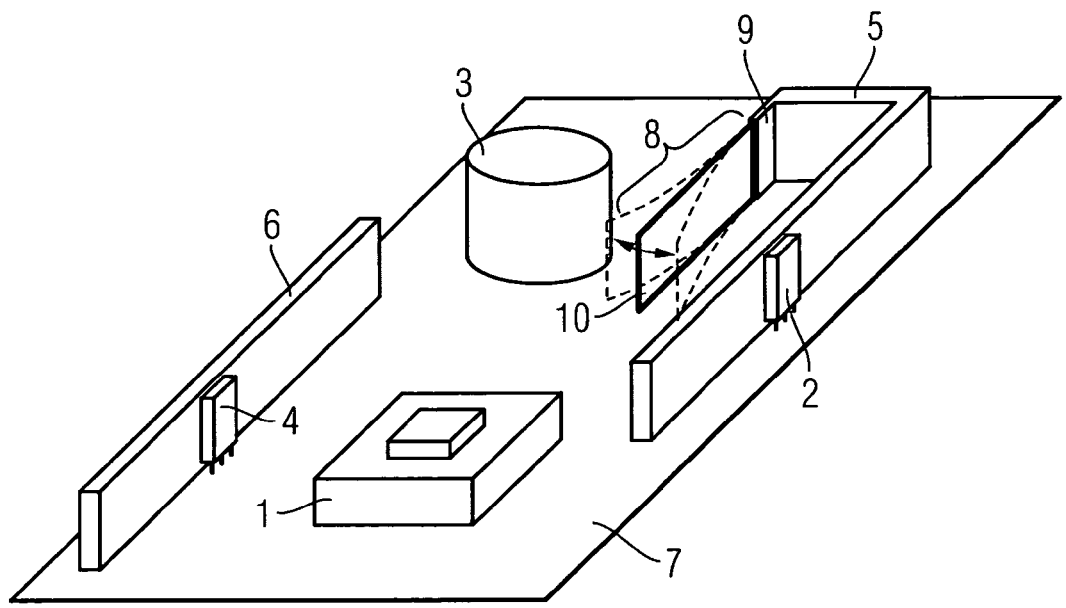
FIG. 1 shows an arrangement of switched mode power supply elements with respect to a piezoelectric fan 8

FIG. 1 shows, in a highly simplified manner, the physical arrangement of the heat-generating elements of a switched mode power supply. A transformer 1, a primary-side switching element 4, a capacitor 3 (for example an electrolyte capacitor) and a secondary-side diode 2 are arranged on a substrate 7. The secondary-side diode 2 is thermally coupled to a first heat sink 5 and the primary-side switching element 4 to a second heat sink 6. The first heat sink 5 also acts as a receiver for the holder 9 of a piezoelectric fan 8.

With its freely swinging end the blade 10 of the piezoelectric fan 8 points in the direction of the transformer 1. The transformer 1 is therefore located in the main flow direction of the air flow generated by the piezoelectric fan 8. As the piezoelectric fan 8 generates a widely-dispersing air flow the elements arranged to the side of the piezoelectric fan 8 are also ventilated and therefore cooled.

When configuring the casing (not shown) of the switched mode power supply it should be noted that the desired air flow can be established by suitable arrangement of ventilation slots for supply air and outgoing air.

The supply voltage for the piezoelectric fan is derived directly from the output voltage for example if the potential situation at the secondary side does not present any insulation problems. Alternatively a supply can be provided by means of primary ancillary supply. To generate the excitation signal either a separate circuit is provided, for example on a substrate integrated in the holder 9, or the excitation signal is generated by means of microcontrollers. As a rule the switched mode power supply has a suitable microcontroller for this purpose to control the primary-side switching element 4. It should be ensured in this connection that the blade 10 is operated within the elastic limit to avoid material fatigue.

Use of the microcontroller provides the advantage that a sinusoidal excitation signal may be easily generated (for example by means of D/A converters or as a smoothed PWM signal), whereby mechanical loading of the piezoelectric fan 8 with respect to a, by way of example, trapezoidal excitation signal is reduced. The life of the piezoelectric fan 8 is increased thereby. The development of noise is also lower with sinusoidal excitation. Control by means of microcontrollers also allows the resonance frequency, which varies slightly for each piezoelectric fan 8, to be stored. This is determined for example for each device in such a way that the piezoelectric fan is operated beyond a predefined frequency range and then the frequency with the highest power consumption is stored as the resonance frequency.

The resonance frequency can also be determined at predefined intervals in this way during regular operation and be compared with the stored value. A change in the resonance frequency beyond predefined tolerance limits (to take account of slight changes as a result of changed environmental conditions) indicates a fault, for example the formation of a crack in the blade 10 or collision with a foreign body. The switched mode power supply can then be automatically switched off and the fault eliminated.

Alternatively a separate circuit for generating the excitation signal can be integrated in the piezoelectric fan, although in this case a trapezoidal signal is usually provided.

Figure 2:
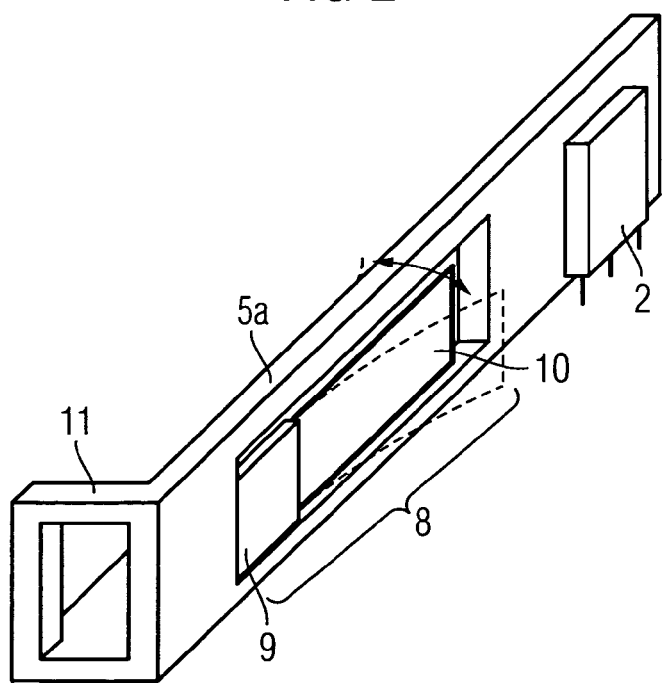
FIG. 2 shows an arrangement of a piezoelectric fan 8 on a heat sink 5*a*

FIG. 2 shows a cooling element 5a formed as an angle section. The cooling element 5a is fastened to the substrate (not shown) by an angled leg. The diode 2 for example rests in a thermally coupled manner against the second angled leg that points orthogonally away from the substrate. This angled leg also has a rectangular opening into which the piezoelectric fan 8 is inserted in such a way that the blade 10 largely fills the opening and the freely-swinging end of the blade 10 points in the direction of the diode 2. The diode 2 and the region of the heat sink Sa that is directly in contact with it are ventilated, and therefore cooled, directly by the piezoelectric fan with this arrangement. An embodiment for the switching element 4 or a combined arrangement is similarly also possible.

To avoid vibrations caused by the piezoelectric fan 9 in a thin heat sink 5a an optional reinforcement 11 is provided at the end face.

Figure 3:
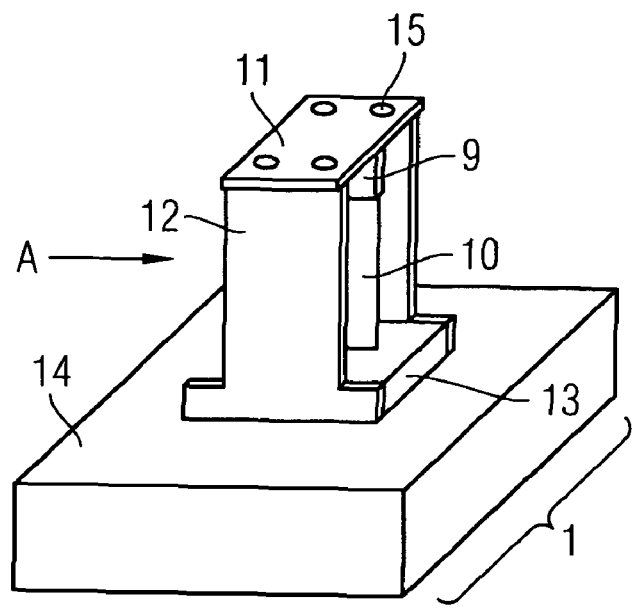
FIG. 3 shows an arrangement of a piezoelectric fan 8 on a transformer 1
Figure 5:
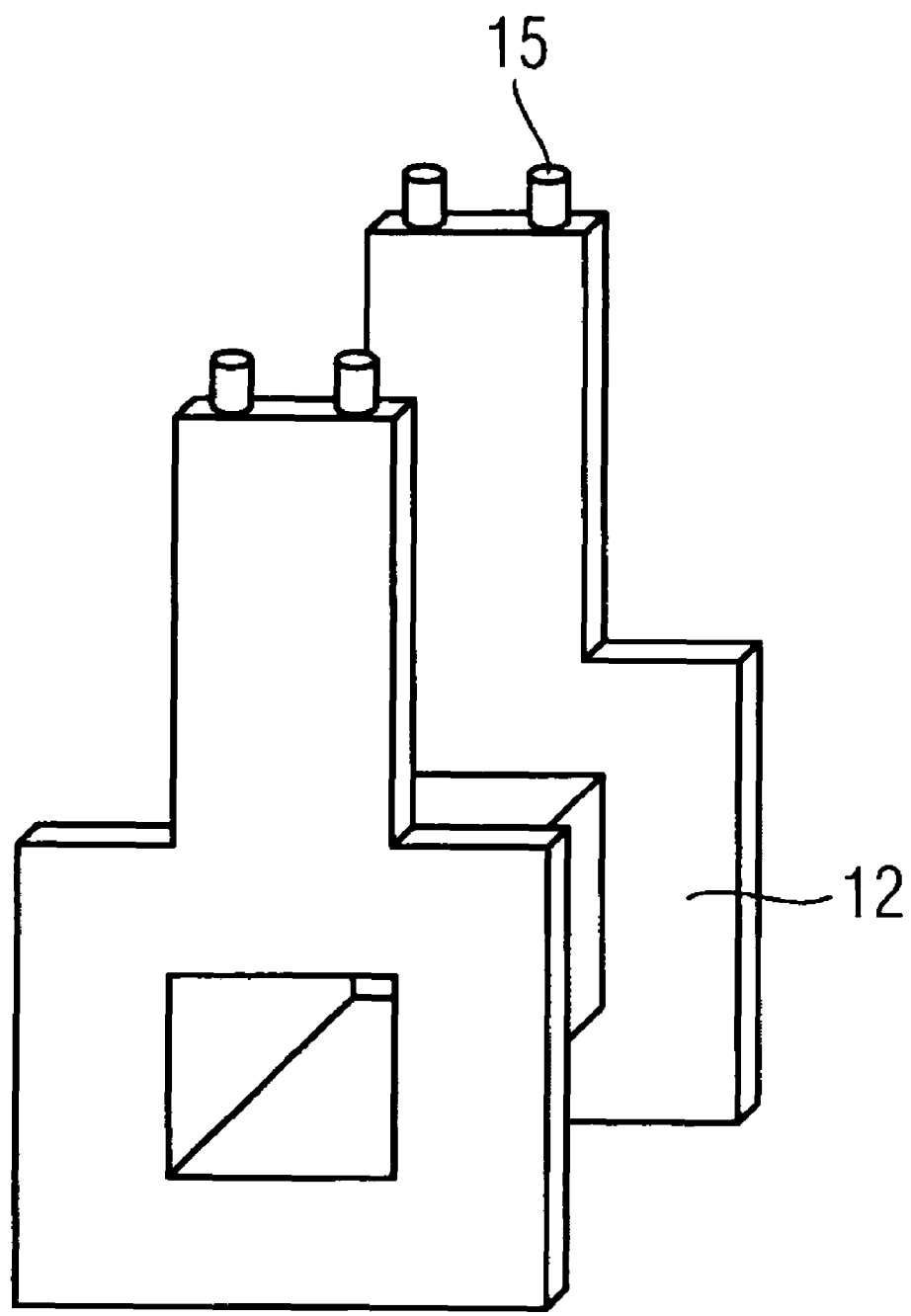
FIG. 5 shows coil formers 12 according to the arrangement shown in FIG. 3

FIG. 3 shows the arrangement of a piezoelectric fan 8 on a transformer 1. The transformer 1 comprises a coil former 12, windings 13—as a rule a primary winding and a secondary winding—and a usually three-legged core 14. The winding former 12 is for example an injected part made from plastics material, as shown in FIG. 5. The substantially spindle-shaped coil former 12 for winding the windings is formed from a hollow rectangular tube with rectangular flanges on the end faces. The middle leg of the core 14 is arranged in the cavity of the rectangular tube while the two outer legs of the core 14 rest on the side of the coil former 12.

Figure 4:
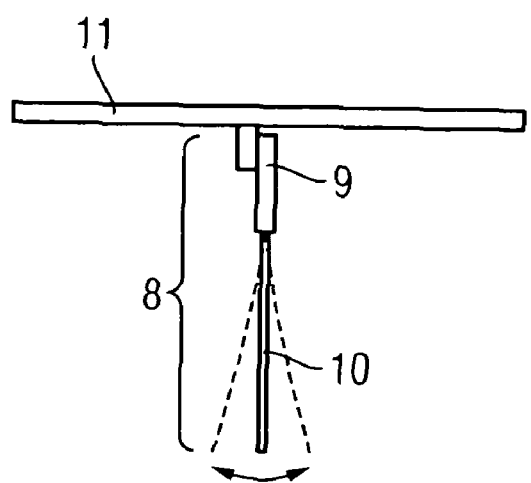
FIG. 4 shows a view A relating to the arrangement shown in FIG. 3

Two projections, moreover, are arranged on the rectangular flanges of the coil former 12 and, on the exposed side of the assembled transformer 1, point away from the windings 13. These projections are slightly longer than a piezoelectric fan 8 provided for cooling the transformer 1 and are used to fasten a bridge-like element 11 for receiving the holder 9 of the piezoelectric fan 8. The bridge-like element 11 can be connected to the two projections by plastics material rivets 15, arranged on the end faces of the projections, or by means of screwed connections. The piezoelectric fan 8 is then arranged parallel to the projections and in the centre of the free space formed by the projections, the bridge-like element 11 and the windings 13, the freely-swinging end of the blade 10 pointing in the direction of the windings 13. FIG. 4 shows the bridge-like element 11 with the piezoelectric fan 8 fastened thereto in a view A illustrated in FIG. 3.

The windings 13 in which most of the heat inside the transformer 1 is generated, are ventilated by means of the piezoelectric fan directly in this arrangement, resulting in efficient cooling of the transformer 1.

Figure 6:
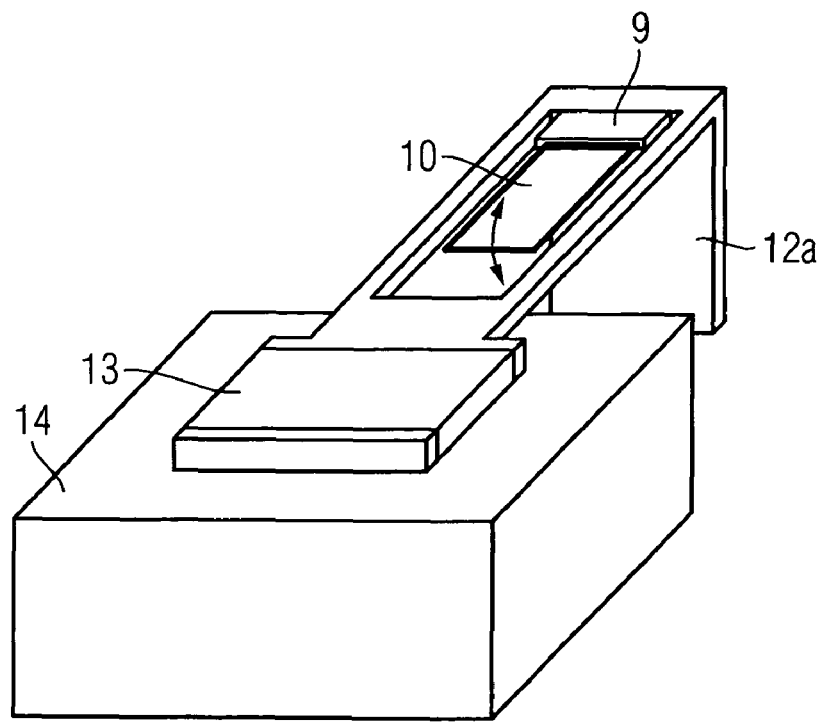
FIG. 6 shows a first alternative arrangement of a piezoelectric fan 8 on a transformer 1
Figure 7:
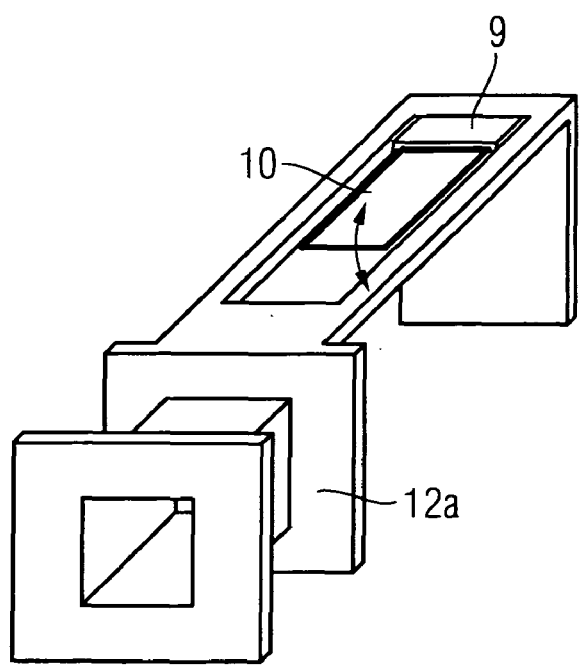
FIG. 7 shows coil formers 12*a* according to the arrangement shown in FIG. 6

FIG. 6 shows a further development of fastening of the piezoelectric fan 8 to the transformer 1. In this case a coil former 12a formed as an injection molded part, as shown in FIG. 7, is provided. A bent projection is arranged on a flange of the coil former 12a, wherein this has a rectangular opening for receiving the piezoelectric fan 8 and at its end is bent again, so this end provides a support on the substrate 1 (not shown here). The projection of the coil former 12a therefore substantially forms a bridge pointing away from the transformer, it being possible to arrange additional switching elements for cooling on the substrate in the free space below this bridge.

The piezoelectric fan 8 is arranged in such a way that the blade 10 largely fills the rectangular opening of the projection, the freely-swinging end of the blade 10 pointing in the direction of the windings 13. It should be ensured in this connection that, in the assembled state, there is a spacing between the freely-swinging blade end and the core 14 surrounding the windings 13. With this development the core 14 is also cooled more intensively along with the windings 13. The additional support of the projection on the substrate, in connection with the stabilizing mass of the transformer, prevents disruptive vibrations owing to the piezoelectric fan oscillations. Furthermore, the cooling effect is not limited to the transformer 1 here, but is also aimed at other circuit elements that can be arranged in the region of the piezoelectric fan 8.

Figure 8:
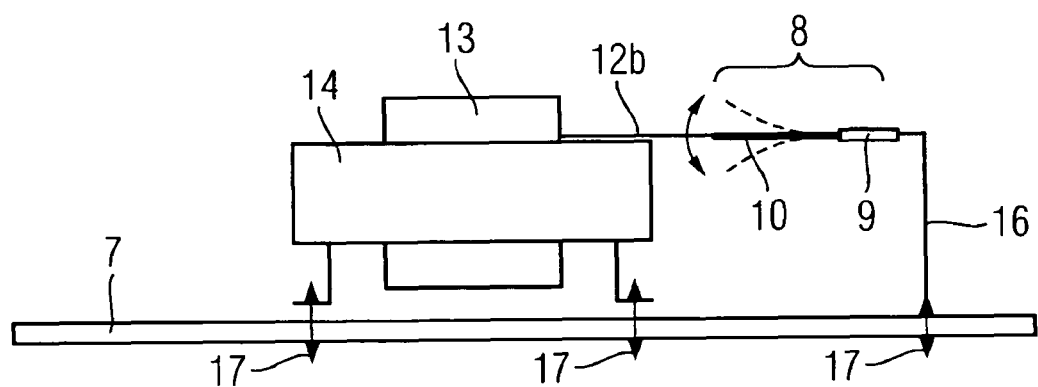
FIG. 8 shows a second alternative arrangement of a piezoelectric fan 8 on a transformer 1
Figure 9:
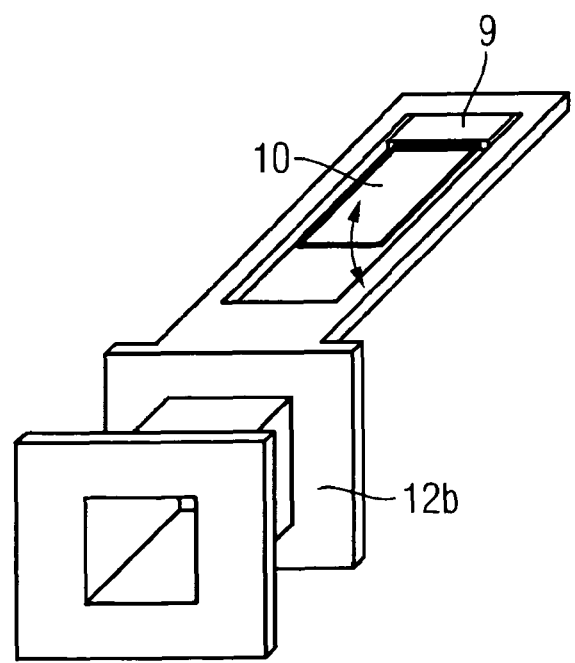
FIG. 9 shows coil formers 12*b* according to the arrangement shown in FIG. 8

FIG. 8 shows a further development of fastening of the piezoelectric fan 8 to the transformer 1. The arrangement substantially matches that shown in FIG. 5 with the difference that the projection of the coil former 12b, as shown in FIG. 9, does not have a bent portion for support on the substrate 7. Impediments when winding the windings 13 onto the coil former 12b are avoided by a projection formed in this way. To nevertheless ensure sufficient stability the end of the projection is connected by means of a support element 16 to the substrate 7. There is therefore a free space again below the projection and this can be used for the arrangement of additional circuit elements for cooling.

The support element 16 is simply connected, for example by means of plastic clips 17, to the substrate.

Figure 10:
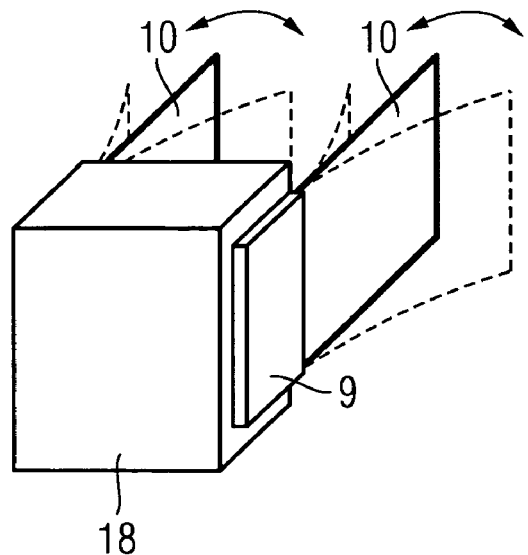
FIG. 10 shows an arrangement of two piezoelectric fans 8 on a block-shaped heat sink 18

To minimize vibrations a fastening variant of two piezoelectric fans 8 shown in FIG. 10 is provided. Two piezoelectric fans 8 are arranged on the side of a fastening element 18, which can also be constructed as a cooling element, in such a way that the forces of inertia of the two swinging blades 10 increase with diametrically opposed excitation. The free ends of the two blades 10 therefore move synchronously toward and away from each other during a swing cycle.

Figure 11:
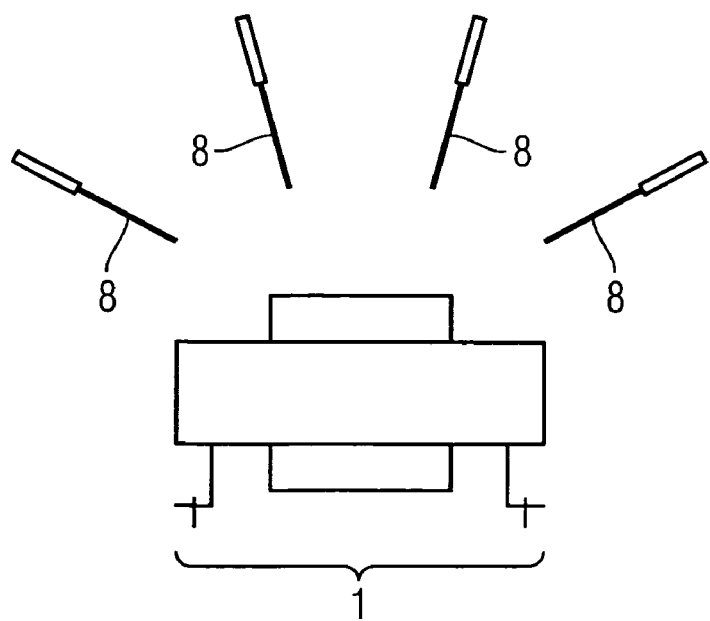
FIG. 11 shows a transformer 1 with a plurality of piezoelectric fans 8

The arrangement of a plurality of piezoelectric fans 8 is expedient in the case of intense heat generation of the transformer 1. These should be arranged as shown in FIG. 11 such that the freely-swinging ends of the blades 10 are directed toward the windings 13 of the transformer 1. An even number of piezoelectric fans 8 is expedient in this case to minimize vibrations due to diametrically opposed swinging of the blades 10.

The invention claimed is:

1. A switched mode power supply, comprising:
    a switching element;
    a diode;
    a transformer comprising:
        a primary winding, connected to a DC voltage via the switching element, and
        a secondary winding, connected to a load via a rectifier circuit including the diode; and
    a piezoelectric fan generating an air flow at the transformer and/or at the switching element and/or at the diode,
    wherein the switching element and the piezoelectric fan are controlled by a microcontroller,
    wherein a control signal causes the piezoelectric fan to swing with a predefined excitation frequency, and
    wherein a separate circuit is integrated into the piezoelectric fan to generate a trapezoidal control signal.

2. A switched mode power supply, comprising:
    a switching element;
    a diode;
    a transformer comprising:
        a primary winding, connected to a DC voltage via the switching element, and
        a secondary winding, connected to a load via a rectifier circuit including the diode; and
    a piezoelectric fan generating an air flow at the transformer and/or at the switching element and/or at the diode,
    wherein the switching element and the piezoelectric fan are controlled by a microcontroller,
    wherein a control signal causes the piezoelectric fan to swing with a predefined excitation frequency,
    wherein the microcontroller detects a power consumption of the piezoelectric fan as a function of the predefined excitation frequency, and
    wherein a resonance frequency is detected at a maximum power consumption.

3. The switched mode power supply as claimed in claim 2, wherein the microcontroller produces a sinusoidal control signal in order to control the piezoelectric fan.

4. The switched mode power supply as claimed in claim 2, wherein the piezoelectric fan is formed from a substantially lamellar blade such that a first end of the blade is arranged to freely swing and a second end of the blade is held in a holder, and
    wherein the blade is electrically conductive, this conductivity is connected to a control unit.

5. The switched mode power supply as claimed in claim 2, wherein by a gradual variation of the predefined excitation frequency, the resonance frequency, which changes as a consequence of environmental influences such as an ambient temperature, is re-adjusted at a predefined interval, and
    wherein a last-adjusted resonance frequency is predefined as the predefined excitation frequency when the switched mode power supply is put into an operation.

6. The switched mode power supply as claimed in claim 2, wherein a power value, detected when a freely-swinging end of the blade of the piezoelectric fan is undamaged, is programmed into the microcontroller for the predefined excitation frequency along with an associated tolerance value, and
    wherein a frequency of the control signal is altered at the predefined interval during the operation such that an altered resonance frequency is detected.

7. The switched mode power supply as claimed in claim 4, further comprising:
    an even number of piezoelectric fans,
    wherein the even number of piezoelectric fans are arranged such that the forces of inertia of the freely swinging end of each of the blades increase with a diametrically opposed synchronous excitation of each of the blades.

8. The switched mode power supply as claimed in claim 4, wherein the holder of the piezoelectric fan is rigidly connected to the transformer.

9. The switched mode power supply as claimed in claim 4, wherein the holder of the piezoelectric fan is rigidly connected to a heat sink arranged in the switched mode power supply.

10. The switched mode power supply as claimed in claim 9, wherein the holder of the piezoelectric fan is rigidly connected to an end of an L-shaped heat sink arranged in the switched mode power supply.

11. The switched mode power supply as claimed in claim 9, wherein the holder of the piezoelectric fan is rigidly connected to an end of a rectangular opening within the heat sink into which the piezoelectric fan is inserted, arranged in the switched mode power supply.

12. A method for operating a switched mode power supply comprising:
    providing a switched mode power supply, comprising:
        a switching element,
        a diode,
        a transformer comprising:
            a primary winding, connected to a DC voltage via the switching element, and
            a secondary winding, connected to a load via a rectifier circuit including the diode, and
        a piezoelectric fan generating an air flow at the transformer and/or at the switching element and/or at the diode; and
    controlling the piezoelectric fan by a control signal causing the piezoelectric fan to swing with a predefined excitation frequency,
    wherein the control signal is produced by a microcontroller,
    wherein the microcontroller detects a power consumption of the piezoelectric fan as a function of the predefined excitation frequency, and
    wherein a resonance frequency is detected at a maximum power consumption.

13. The method as claimed in claim 12, wherein the control signal is a sinusoidal signal.

14. The method as claimed in claim 12,
    wherein by a gradual variation of the predefined excitation frequency, the resonance frequency, which changes as a consequence of environmental influences such as an ambient temperature, is re-adjusted at a predefined interval, and
    wherein a last-adjusted resonance frequency is predefined as the predefined excitation frequency when the switched mode power supply is put into an operation.

15. The method as claimed in claim 12,
    wherein a power value, detected when a freely-swinging end of the blade of the piezoelectric fan is undamaged, is programmed into the microcontroller as the predefined excitation frequency along with an associated tolerance value, and
    wherein a frequency of the control signal is altered at the predefined interval during the operation such that an altered resonance frequency is detected.

* * * * *